United States Patent [19]

Maheras et al.

[11] Patent Number: 4,859,573
[45] Date of Patent: Aug. 22, 1989

[54] MULTIPLE PHOTORESIST LAYER PROCESS USING SELECTIVE HARDENING

[75] Inventors: George Maheras, Fort Collins; Hubert O. Hayworth, Loveland, both of Colo.; Michael R. Gulett, Freemont, Calif.

[73] Assignee: NCR Corporation, Dayton, Ohio

[21] Appl. No.: 89,014

[22] Filed: Aug. 21, 1987

Related U.S. Application Data

[63] Continuation of Ser. No. 870,059, Jun. 3, 1986, abandoned, which is a continuation of Ser. No. 639,875, Aug. 13, 1984, abandoned.

[51] Int. Cl.$^4$ .............................................. G03C 5/00
[52] U.S. Cl. .................................. 430/326; 430/312; 430/328; 430/394
[58] Field of Search ............... 430/312, 322, 327, 328, 430/330, 394, 326; 427/38, 41

[56] References Cited

U.S. PATENT DOCUMENTS

| | | | |
|---|---|---|---|
| 4,068,018 | 1/1978 | Hashimoto et al. | 430/5 |
| 4,241,165 | 12/1980 | Hughes et al. | 430/269 |
| 4,253,888 | 3/1981 | Kikuchi | 148/187 |
| 4,352,870 | 10/1982 | Howard et al. | 430/271 |
| 4,394,437 | 7/1983 | Bergendahl et al. | 430/312 |
| 4,454,221 | 6/1984 | Chen et al. | 430/316 |
| 4,499,177 | 2/1985 | Vollenbroek et al. | 430/311 |

FOREIGN PATENT DOCUMENTS

0103337 3/1984
1146297 3/1969 United Kingdom .

OTHER PUBLICATIONS

Thompson et al, Introduction to Microlithography, ACS Symposium Series 219, American Chemical Society, 1983, pp. 218–229.
Dobkin et al, "Plasma Formation of Buffer Layers . . . ", IEEE Electron Device Letters, vol. EDL-2(9) Sep. 1981, pp. 222–224.
Johnson et al, "Single Coat Photoresist Lift-off Structure," IBM Tech. Discl. Bull., vol. 19(3), Aug. 1976, p. 859.

(List continued on next page.)

Primary Examiner—Joseé G. Dees
Attorney, Agent, or Firm—Wilbert Hawk, Jr.; Casimer K. Salys

[57] ABSTRACT

A process for selectively hardening a surface layer of a polymeric photoresist to make such surface layer opaque and insoluble in photoresist carrier solvents, where such selectivity is coextensive with the polymeric/monomeric pattern created in the photoresist. Representative hardening processes include controlled exposure to certain gas plasmas, ion bombardment, or irradiation by ultraviolet radiation of chosen wavelength range. The selectively hardened polymeric regions act as a barrier to the carrier solvent in which the polymer film is laid down and to the developer subsequently employed to remove the monomeric regions. The hardened polymeric regions further exhibit an actinic radiation barrier property preventing radiation depolymerization. In one form the process may be used in a two-layer photoresist structure, where the pinhole-covering thicker second layer is laid down and exposed before developing the monomeric regions of the thinner first layer. Thereafter, a single development operation serves to remove the monomeric regions of both layers. The actinic barrier prevents depolymerization of the monomeric regions of the first layer during the second exposure. In a second application of the selective conversion process, the actinic barrier property of the hardened surface is used to form a conformable mask on a thick, single planarizing layer of photoresist. According to this practice, the photoresist is first locally depolymerized to a fraction of its depth. After a hardening process the selectively hardened surface layer of the photoresist layer constitutes a barrier to actinic radiation. The succeeding flood illumination thereby extends the pattern formed as the monomeric region down to the substrate.

7 Claims, 4 Drawing Sheets

OTHER PUBLICATIONS

Chiu et al, "Resist Lift-Off Mask with Controllable . . . ," *IBM Tech. Dis. Bull.,* vol. 21(9), Feb. 1979, p. 3623.

E. Ong et al., "Multilayer Resists for Fine Line Optical Lithography", *Solid State Technology,* pp. 155-160, Jun. 1984.

Bassous et al., "Forming Resist Images by Portable Conformable Masking Technique", *IBM Technical Disclosure Bulletin,* vol. 25, No. 11B, Apr. 1983, pp. 5922-5924.

Lin, "Portable Intimately Contacted Mask", *IBM Technical Disclosure Bulletin,* vol. 21, No. 5, Oct. 1978, p. 2133.

Horng et al., "Superimposition of Photoresist Patterns", *IBM Technical Disclosure Bulletin,* vol. 26, No. 3B, Aug. 1983.

Chiu et al., "Resist Lift-Off Mask with Controllable Overhand Thickness", *IBM Technical Disclosure Bulletin,* vol. 21, No. 9, Feb. 1979, p. 3623.

Gardner et al., "Double-Resist Layer Shadow Masking", *IBM Technical Disclosure Bulletin,* vol. 19, No. 1, Jun. 1976, pp. 156-157.

Johnson et al., "Single Coat Photoresist Lift-Off Structure", *IBM Technical Disclosure Bulletin,* vol. 19, No. 3, Aug. 1976, p. 859.

Patents Abstracts of Japan, vol. 1, No. 18, Mar. 24, 1977, p. 413E76 and JP, A, 51-1114931 (Hitachi) Sep. 10, 1976.

PRIOR ART

FIG. 2A

PRIOR ART

FIG. 2B

PRIOR ART

FIG. 2C

PRIOR ART

MULTIPLE PHOTORESIST LAYER PROCESS USING SELECTIVE HARDENING

This is a continuation of co-pending application Ser. No. 06/870,059 filed on June 3, 1986 now abandoned, which is a continuation of co-pending application Ser. No. 06/639,875 filed on Aug. 13, 1984 abandoned.

TECHNICAL FIELD OF THE INVENTION

The invention relates to photolithographic barrier masking, and has its most important application in photolithographic barrier masking as applied to semiconductor process technology.

BACKGROUND OF THE INVENTION

The production of large scale integrated circuit semiconductor devices by the formation of patterned photoresist, interchangeably referred to herein as a resist, barrier layers on semiconductor wafers, interchangeably referred to herein as substrates, requires that such photoresist layers be sufficiently precise in shape and location to allow the reliable manufacture of extremely small structural configurations, and further that such layers be free of spurious hole defects. It is commonly known that the presence of such "pinhole" defects can when masking dielectric layers expose such layers to unwanted etching therethrough, and consequential short circuit paths following metallization. Because a defect in a single conductive path or device can cause a complete integrated circuit chip, consisting of thousands of such devices, to be inoperative, the elimination of such flaws has given rise to a variety of techniques aimed at holding their occurrence to an absolute minimum. Subsequent discussions will be concerned mainly with the use of such barrier layers as etching barriers; however, the limitations of the prior art and the advantages of the present invention thereover are equally applicable with respect to the common practice of using such patterns as selective masks for deposition, ion implantation, diffusion, lift-off, etc. operations.

Positive photoresists, those presently preferred for semiconductor processing, are usually formed from a polymer dissolved in an appropriate carrier solvent to create a lacquer, which lacquer is applied by conventional spin-on techniques to form a thin solid layer over a substrate after the carrier solvent is removed by evaporation. A subsequent selective exposure of the resist layer to depolymerizing wavelength radiation passed through a patterned mask, or alternatively by means of a direct projection of such actinic radiation, causes local depolymerization of the irradiated resist to the form of a monomer. Subsequent immersion of the resist coated substrate into a developer solvent having the ability to dissolve the resulting monomer, while having no substantial attack rate on the unexposed polymer, causes a retention of the desired polymer photoresist pattern. Alternatively, the selectively exposed layer may be "dry developed" by exposure to ionic plasmas of certain gases having similar selective dissolving characteristics.

For maximum resolution, i.e. to produce the smallest apertures in the resist, the thickness of the resist layer must be held to values of 500 nanometers or less. Unfortunately, resist barriers this thin very frequently exhibit flaws, in the nature of random pinhole defects. Such flaws arise from a variety of sources, including dust particles in the photolithographic system and mask defects. To prevent such pinholes in the resist barrier from giving rise to spurious etching patterns, a technique commonly employed in the prior art (see FIGS. 2A-2D) is to apply a second substantially thicker resist layer, initially in liquid form as before and frequently of the same composition as the first resist layer, over the first layer, after the first layer has been developed and suitably processed (hardened). The hardening ensures that the first layer is separated by an insoluble barrier from the carrier solvents in the second layer. The hardening process will be discussed subsequently. However, it should be recognized that without such a hardening process the carrier solvents of the second resist layer would immediately attack the patterned first layer of resist when the second layer is applied.

This second photoresist layer is typically applied to have a thickness in the range of 1000 to 2000 nanometers, a thickness sufficient to be substantially free of pin holes, but too thick to allow the formation of patterns as finely detailed as in a 500 nanometer thick layer. In addition, to avoid the position correspondence of mask defect induced pin holes which might appear in even 2000 nanometer photoresist, the second layer is exposed to an actinic radiation pattern using a different mask, with a slightly coarser pattern. Thereby, the second layer is exposed over and around the immediate region of the small, high resolution, aperture in the first layer. Upon subsequent development, the composite two-layer structure would in principle provide a high resolution aperture in the first layer communicating with a correspondingly positioned yet somewhat larger aperture in the upper layer.

In practice this approach frequently causes a loss of resolution as to small passages in the first layer because the region of the first layer defining each high resolution aperture has been exposed and developed twice. It is well-known in the art that a single exposure and development cycle tends to produce positive sloping aperture walls. Two such exposure and development cycles increase the degree of the slope in the first layer, leaving a tapered rather than vertical photoresist aperture. A tapered aperture is undesirable, particularly if the photoresist mask is to subsequently be employed to define an ion implant pattern. Thus, there remains a need for a high resolution photoresist process which provides a resist barrier which is adequately pinhole free, and which also maintains the requisite shape of the high resolution photoresist pattern resolution. A successful process would preferably also be characterized by a reduced number of handling steps as compared with the above mentioned two layer process, such as would be obtained if the process required only one development step.

Another photoresist resolution problem arises because of the multi-layered nature of present integrated circuit semiconductor devices. The surface topography of integrated circuit wafers in the latter stages of fabrication is far from planar, being characterized by a multiplicity of steps each of the general order of several hundred nanometers, such steps representing the edges of metallizations, nitride capping layers, and a variety of other layer boundaries which are inherent to the particular fabrication processes used. To achieve the resolution required for the small geometries presently sought, focus and fringing defects must be minimized by using a highly planar photoresist surface during exposure. If the photoresist layer is too thin, it will generally replicate the surface topography of the substrate. Thus, it becomes necessary in the latter stages of fabrication to employ photoresist films of substantially increased thickness to planarize the surface topography. Such "planarizing" layers are typically chosen to be two thousand to three thousand nanometers thick.

Figure 4A:
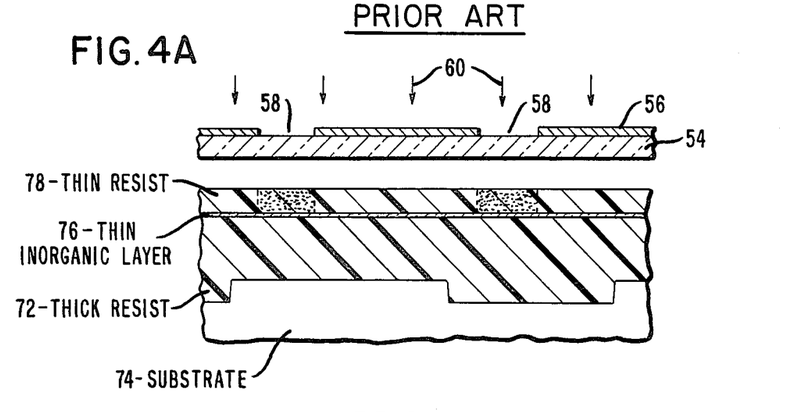
Figure 4B:
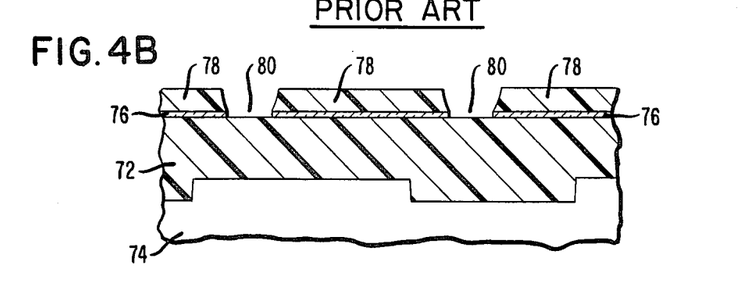
Figure 4C:
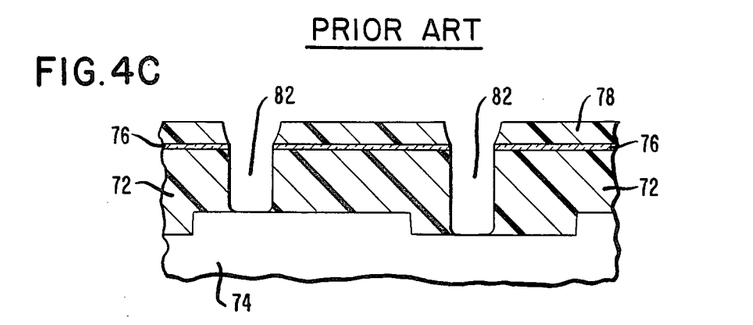

To achieve maximum pattern resolution in a barrier produced from such a thick resist layer, it is common to form a three layer masking structure, using a relatively thick photoresist layer of two microns thickness or greater, covered by multiple thin supplemental barrier layers. In practice the top layer is a thin photoresist and the next layer down is formed of an inorganic material such as silicon dioxide. By following a complex series of pattern exposures, etches, and two separate photoresist development steps, a masking structure of adequate resolution is achieved to provide the substrate etching barrier. FIGS. 4A-4C show such a conventional system, discussion of the details of which will be deferred to the Description of the Invention. A detailed discussion of this technique appears in the article "Multilayer Resists for Fine Line Optical Lithography" by Ong et al., *Solid State Technology*, p. 155 (June 1984).

The above mentioned processes are not only quite complex but they inherently require multiple manual handling operations involving additional costs and likelihood of damage. Wafer damage occurring in the latter stages of processing is a significant concern, since the individual wafers have become quite valuable by this point.

SUMMARY OF THE INVENTION

As previously indicated, in multilayer photoresist technology it is usually necessary to harden an exposed and developed photoresist layer to prevent the carrier solvents of the second layer of photoresist from obliterating the pattern in the first layer. This hardening process induces a crosslinking of molecules in a surface layer of the solid polymer constituting the developed first layer, and may be accomplished by a variety of methods, e.g. exposure to a thermal treatment, a gas plasma, ion bombardment, or certain wavelengths of ultraviolet light. Examples of plasma hardening of polymeric resist layers are disclosed in U.S. Pat. No. 4,253,888 granted to inventor Kikuchi.

The applicants have found that some of these hardening techniques, which are used to render certain polymeric positive photoresists insoluble in the solvents in which they would otherwise be dissolved, are selectively operable on only the polymeric portions of an exposed but not yet developed layer, so that it is not necessary to develop the first layer to remove the exposed monomer from it before hardening, as was heretofore the practice. After the second photoresist layer is formed over the first and exposed to actinic depolymerizing radiation, normally defining an area somewhat larger than that of the first photoresist layer but coaxial therewith, both monomeric regions can be removed in a single development step. Such selective hardening techniques include properly controlled overall exposure to plasmas of certain gases or to positive ion bombardment, and are postulated to include ultraviolet irradiation over a range of wavelengths which crosslink but do not depolymerize.

The term "actinic" will be employed hereinafter exclusively to describe normal depolymerizing radiation, as distinguished from those wavelengths of ultraviolet which are postulated to selectively harden (crosslink) without causing substantial depolymerization.

Thus, the present selective hardening process allows fabrication with a second, effective pinhole covering type, layer without adversely affecting the good resolution provided by the thin first photoresist layer, while also reducing the number of handling steps to which the substrate must be subjected. It is noteworthy that the above mentioned Kikuchi reference relates to plasma hardening of exposed and developed, polymer, photoresist materials, and does not suggest applying the plasma to any exposed but undeveloped photoresist layer, as is done in the present invention.

The above described feature of the invention, and another feature to be described, take advantage of the fact that the selectively hardened and crosslinked surface regions of the first photoresist layer were found to act as a screen during subsequent exposure of the second layer to actinic radiation, which radiation would otherwise depolymerize all underlying first layer polymer. In particular, the actinic radiation masking function of the hardened areas in the first photoresist layer prevents depolymerization of the first layer to the extent of the coarser pattern in the second photoresist layer.

Examples of commercially available photoresist materials exhibiting the aforementioned selective hardening features are type AZ4210 positive photoresist manufactured by American Hoerch Corporation and type HPR204 positive photoresist manufactured by Hunt Chemical Company.

According to a related specific feature of the invention as applied to the production of patterns of good resolution on relatively thick "planarizing" photoresist layers, a layer of chosen thickness is applied and then exposed to an actinic radiation pattern sufficiently long to depolymerize only the surface regions of the layer. The photoresist film is then selectively hardened by any of the above mentioned methods, thereby forming on each unexposed polymeric region an actinic radiation opaque masking layer of hardened polymer. Thereby the original mask pattern is replicated as a high resolution pattern on the surface of the thick photoresist layer. A subsequent general "flooding" exposure by actinic ultraviolet radiation selectively depolymerizes only the unmasked regions of the thick photoresist layer lying directly beneath the formerly exposed surface areas.

According to the practice of the present invention, the complex series of procedures outlined in the Background of the Invention for producing high resolution patterns in thick, planarizing photoresist layers is rendered unnecessary. Additionally, only a single photoresist layer need be laid down, as contrasting with the conformable mask systems according to the prior art.

An alternative approach is disclosed in U.S. Pat. No. 4,352,870 issued to Howard et al., which discloses the use of a two layer resist composition wherein the upper thin layer of resist is used as a high resolution mask to control electron beam removal of the lower photoresist layer. Backscattered electrons provide a measure of undercut to control the resolution of the system. Because of the nature of the undercutting process, a basic restriction on unsupported spans between apertures is imposed (column 4, lines 60-63), a limitation not present in the process of the present invention.

Other features and advantages of the invention will become apparent upon making reference to th specification to follow, the drawings, and the claims.

BRIEF DESCRIPTION OF THE DRAWINGS

FIGS. 4A–4D depict the corresponding steps of a typical three layer prior art process used to accomplish the same end result as shown in FIG. 3D, showing initial pattern imaging of an upper photoresist layer, use of a developed pattern in this layer to etch apertures in an intermediate inorganic layer, and the resulting final structure after the apertures in the intermediate layer have been used as a mask for selective removal of photoresist in the lower layer, respectively

DETAILED DESCRIPTION OF THE INVENTION

The selective hardening feature of certain processes on certain positive photoresists, as mentioned in the Summary of the Invention, permits substantial improvement in two areas of photolithographic (photoresist) technology, namely the fabrication of high resolution pinhole-free photoresist mask patterns and the fabrication of such patterns using thick "planarizing" photoresist layers. In more detail, the applicants have found that if a solid polymeric film of positive photoresist such as the type AZ4210 manufactured by American Hoerch Corporation or type HPR204 manufactured by Hunt Chemical Company is locally exposed by standard actinic radiation of wavelength about 400 nanometers, thereby converting the exposed areas from polymeric to monomeric form, and next generally exposed overall to a discharge plasma of a chosen gas or mixture of gases, two things occur: first, the surface of the polymeric regions is rendered substantially insoluble in the polymeric photoresist carrier solvent, while the monomeric regions remain soluble in the standard sodium hydroxide based developer used to selectively extract the monomer, i.e. to develop the pattern images; and second, the polymeric regions so treated or "selectively hardened" are substantially opaque to subsequent exposures of actinic radiation which would normally cause the depolymerization thereof.

Such selective hardening has been accomplished by using nitrogen, helium or argon plasmas, and by other forms of positive ion bombardment, e.g. sputtering bombardment and ion implant. Additionally, it can be reasonably postulated that since the monomeric form is the lowest energy state of the chemical system, i.e. the most stable state, requiring the most energy to crosslink (harden), and since it is known from the spectral selectivity of the above-mentioned resist material that long exposure is necessary to secure substantial crosslinking at shorter wavelengths, e.g. 280 nanometers, it can be expected that controlled exposure to such short wavelength radiation would also achieve the same selective hardening of the surface without inducing substantial depolymerization.

Figure 1A:
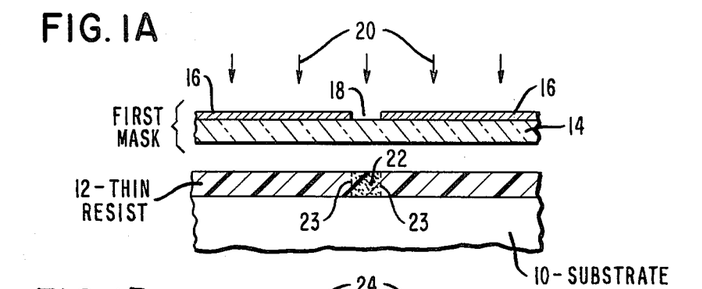
FIGS. 1A–1D are cross-section views of a substrate subjected to a two layer photoresist process of the form in the present invention, showing pattern exposure depolymerizing a small circular central region of a photoresist film deposited on a substrate, the film and substrate after selective surface hardening of the upper surface of the photoresist layer, a subsequent exposure of a larger circular surrounding region in a second photoresist layer applied over the first layer, and the structure after a single final development respectively.

A specific application of both of the above-mentioned features of the selective hardening processes is illustrated in FIGS. 1A through 1D, illustrating, for example, the formation of a small circular aperture protected by a second, thicker pinhole sealing layer having a somewhat larger communicating aperture or passage therein. As shown in FIG. 1A, a substrate 10 is coated with a high resolution first layer 12 of suitable photoresist polymer, the layer thickness being chosen to be nominally in the 500 nanometer range for optimum resolution. The polymer is preferably applied in lacquer form in a carrier solvent, after which the solvent is evaporated in a conventional way. To produce a given aperture in the first layer 12, a photoresist mask including transparent plate 14 having an opaque metallic patterned layer 16 thereon, with an aperture 18 therein, is placed in proximity to the upper surface of the first layer 12. By illuminating the upper surface of the mask with collimated actinic radiation, here shown schematically represented by parallel arrows 20—20, a local depolymerization of the first layer 12 polymer to a monomer is induced in the region generally indicated as 22 and having a boundary 23. At this point a latent image of aperture 18 exists within region 22 of the first layer 12.

Figure 1B:
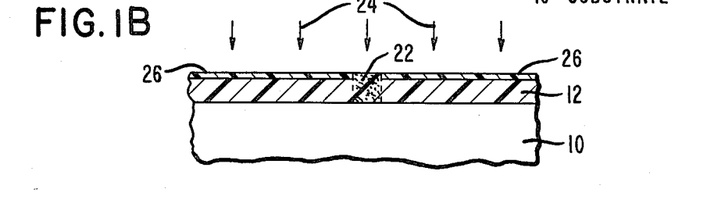

The wafer in FIG. 1A is then subjected to selective surface hardening by exposure of the entire surface of the first layer to one of the hardening agents described above, as schematically indicated by the arrows 24-24 of FIG. 1B. This produces a crosslinked, very thin surface region 26 on the still polymerized portions of the first layer 12. Note, however, that monomer region 22 remains unaffected and lacking any surface region comparable to region 26.

As previously discussed, the hardening technique may involve ion bombardment using a gas plasma, direct ion bombardment from an ion source, or high energy irradiation using ultraviolet light having a wavelength which will crosslink the polymer without converting it to the monomeric form.

The preferred hardening process is the gas plasma process wherein the wafer 10 bearing the latent image 22 in the resist layer 12 is placed in a plasma chamber. A variety of systems are commercially available for plasma etching and photoresist removal, and may be adapted to produce selective hardening or crosslinking. One such unit, made by International Plasma Corporation of Hayward, California and designed for radio frequency excited plasma etching, can give reliable selective crosslinking when operated at a discharge excitation frequency of 13.5 MHz, a power of one-half kilowatt, and a gas pressure of 1 torr of nitrogen for twenty minutes. Selective crosslinking has also been secured by use of argon plasmas.

After such treatment the type AZ4210 photoresist previously mentioned will show selective crosslinking of the polymeric surface portion 26 in all regions except over the monomeric region 22. Such crosslinked layers are known to be insoluble in the normal sodium hydroxide based developer used with such resist.

Figure 1C:
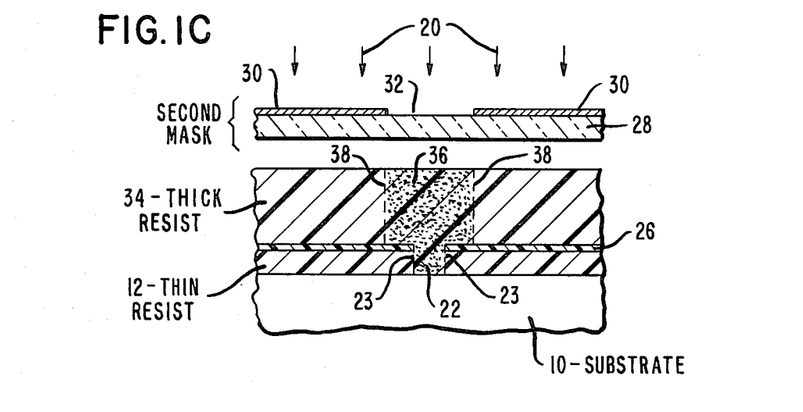

Next, as shown in FIG. 1C, and prior to the use of any developer, a second layer 34 of preferably but not necessarily the same resist and having preferably a thickness 2,000-3,000 nanometers is applied over the first resist layer 12. A second mask, with plate 28 having an aperture 32 in an opaque layer 30, allows incident collimated actinic radiation 20 to illuminate not only the original latent image region 22 of the first layer 12, but also a larger region 36 extending beyond the original latent image and having a boundary 38 associated therewith separating the central monomer region 36 produced by the second irradiation from the surrounding polymer portion. It will be noted that the latent image region 22 in the first layer has been exposed twice at this point whereas the polymeric regions of first layer 12 falling beneath boundary 38 remain unexposed by virtue of opaque crosslinked surface region 26.

The wafer bearing the two photoresist layers 12 and 34 is then preferably developed in the conventional sodium hydroxide based developer appropriate for the resists. The finished photoresist mask pattern, depicted in FIG. 1D, shows a central aperture 40 having boundaries 44—44 communicating to a larger passage 42 in the upper resist layer 34.

Figure 1D:
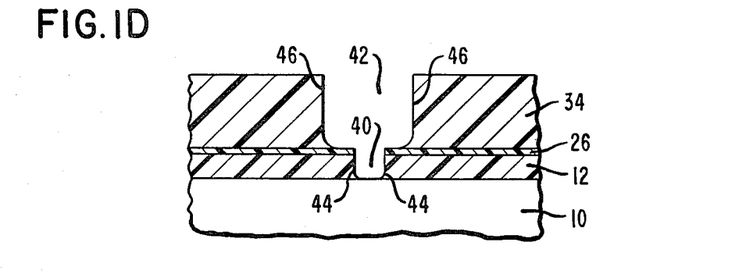

The aperture profiles 44—44 and 46—46 as drawn in FIG. 1D are representative of the profiles produced in such double layer structures. This has been verified by electron microscopy. In particular, the inward encroachment of the walls 44—44 of the small aperture 40 and of the walls 46—46 of the large aperture as shown in FIG. 1D are of routinely encountered in developed photoresist patterns. It will be noted that such profiling tends to make the actual area of the substrate 10 which will be exposed to subsequent etching or other processing somewhat smaller than the mask aperture 18 shown in FIG. 1A. Such closing-down of apertures is a well-known aspect of photoresist technology, and is believed to have its origin in optical diffraction effects associated with the formation of small selectively illuminated areas in films of thickness of the order of a wavelength. As a result, the polymeric-monomeric transitions across such boundaries 38—38 and 23—23 are not abrupt, but tend to be gradual, and the boundary positions vary with depth as well, resulting in final boundaries as shown in FIG. 1D after development. For a given thickness of the first film 12, a minimum value is normally established for the aperture 18 of the first mask 14 (FIG. 1A), below which the lower boundary encroachment indicated by container 44—44 of FIG. 1D become too severe to tolerate. In extreme cases complete seal-off of the passage 40 occurs. It will therefore be appreciated that if a conventional two-layer photoresist process had been used wherein the pattern shown in FIG. 1A is first developed out and then crosslinked, followed by a second layer applied and exposed as shown in FIG. 1C, then a double exposure and development of the central aperture area would have been undertaken, possibly resulting in total blockage of the desired central aperture.

Figure 2A:
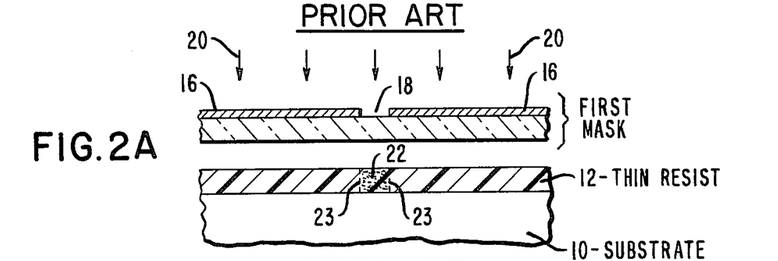
FIGS. 2A–2D are cross-section views of a substrate subjected to a two photoresist process representative of the prior art.
Figure 2B:
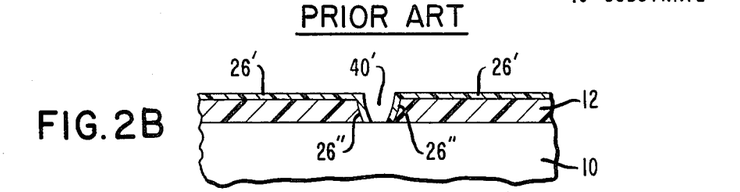
Figure 2C:
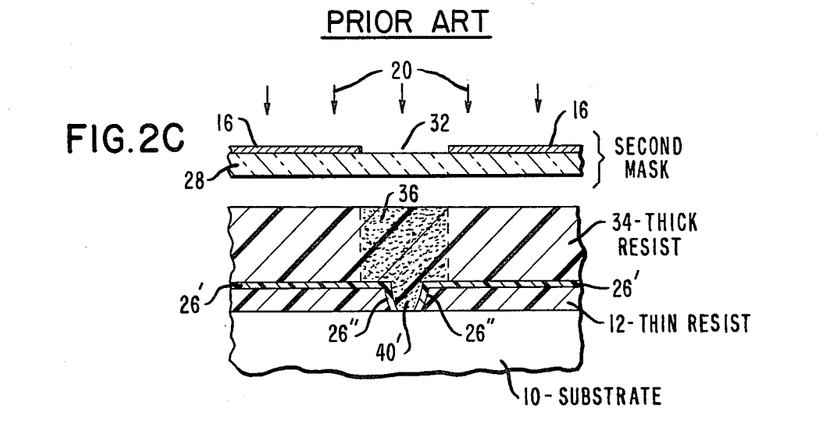
Figure 2D:
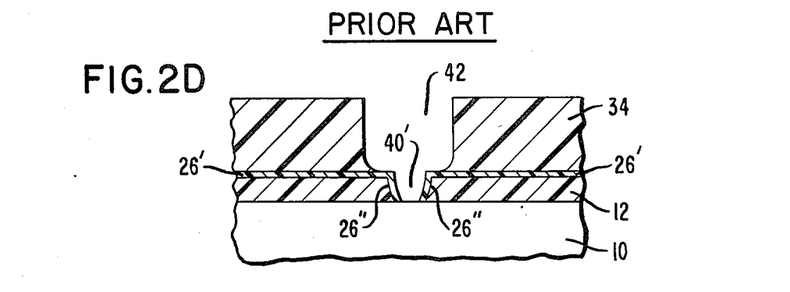

FIGS. 2A through 2D illustrate a conventional prior art sequence wherein an initial pattern exposure is carried out (FIG. 2A), followed by developing and hardening to form a layer 26' (FIG. 2B), followed by a second application of photoresist wherein the polymer of the upper layer fills the lower aperture 40', followed by a second exposure (FIG. 2C), and a final development (FIG. 2D).

It will be noted that after hardening (FIG. 2B), the small aperture wall boundaries 26" are effectively frozen, since the hardening of the walls 26" and surface 26' seals the underlying layer 12 against developer solvent action. On the other hand, no such wall barriers are present in the process shown in FIGS. 1A-1D. In particular, it will be noted that further developable depolymerization of the wall boundary regions 23—23 (FIG. 1C) can be achieved during the second exposure. Thus, the final boundary profiles 44—44 (FIG. 1D) are well-resolved down to the substrate 10 after development. A smaller aperture 18 on the mask 14 may thus be used for initial exposure (FIG. 1A) without causing seal-off of the final aperture 40 of FIG. 1D.

The well defined wall profiles 44—44 of the small aperture 40 as shown in FIG. 1D are routinely observed, and would not in general be expected if the crosslinked surface portion 26 were transparent to the actinic radiation 20 during the step shown in FIG. 1C. If the crosslinked surface portion 26 were transparent, then a general conversion to monomer of the first layer 12 would occur at all points below the upper irradiated region defined by boundaries 38—38 thereof. If such were the case, then upon development it would be expected that the boundaries 44—44 of the central aperture of the pattern shown in FIG. 1D would be enlarged, having spread substantially under the crosslinked layer 26 as a result of the solvent action. That such is in fact not observed confirms that the crosslinked surface portion 26 is in fact opaque to the actinic radiation 20 used for depolymerization. This discovery is used in the form of a second embodiment of the invention, shown in FIGS. 3A-3D, to which reference should now be made.

Figure 3A:
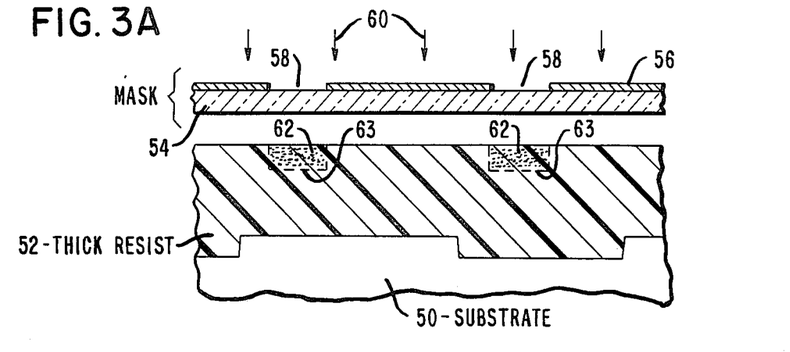
FIGS. 3A–3D are cross-sectional views of a substrate subjected to a single, planarizing layer photoresist process, showing local surface exposure of the desired regions of the photoresist, selective hardening of the outer surface of the polymeric photoresist to render it selectively ultraviolet opaque, flooding of the structure to extend the depolymerized surface layer down to the substrate, and the resulting structure after development, respectively.

FIGS. 3A through 3D show the use of the actinic radiation screening action of selectively crosslinked portions of a photoresist layer as applied to the fabrication of high resolution patterns on a thick planarizing photoresist layer. In FIG. 3A a topologically nonplanar substrate 50 coated with a thick layer of photoresist of thickness of the order of 2,400 nanometers is exposed to actinic radiation 60 through a mask composed of plate 54 having an opaque masking layer 56 with apertures 58—58 therein. The intensity and duration of exposure are controlled so that corresponding monomeric regions 62—62 are formed only to a depth of preferably 400 nanometers, as indicated by boundaries 63—63. As previously indicated, although the pattern of monomeric latent image regions 62—62 of FIG. 3A are shown as produced with a contact type masking, it is with equal merit applicable to projected actinic images.

The photoresist layer 52 is next subjected (FIG. 3B) to exposure to any of the selective hardening agents 64 previously described, thus producing crosslinked surface areas 66 at all points except over the monomeric regions 62 on the surface of the resist layer 52. At this point a mask for actinic radiation is "fixed" over the entire top surface of the resist layer 52.

Figure 3B:
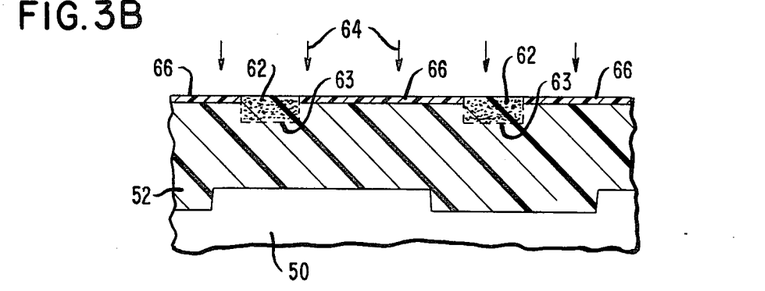
Figure 3C:
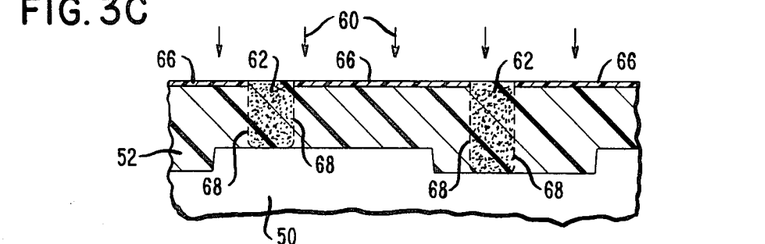
Figure 3D:
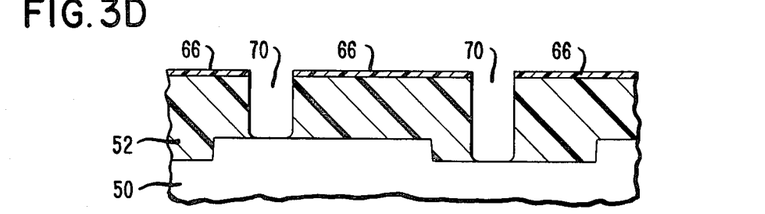

Since the crosslinked surface portions 66—66—66 are substantially opaque to actinic radiation, a subsequent general flooding exposure (FIG. 3C) to actinic radiation 60—60 causes only the original monomeric regions to be fully exposed. The flooding exposure is selected to be of sufficient duration and intensity to ensure that the polymeric regions of the photoresist layer 52, below the shallow monomeric regions 63—63 in FIG. 3B, are fully converted to monomeric regions, having boundaries 68—68, down to the substrate 50. A subsequent conventional development removes these monomeric layers, as shown in FIG. 3D, to leave etching apertures 70—70, thereby completing the fabrication of the photoresist masking layer.

This is to be contrasted with the customary three-layer practice of the prior art, as illustrated in FIGS. 4A–4C. FIG. 4A shows a thick planarizing photoresist layer 72, composed of PMMA or similar material, deposited over a substrate 74, and over which is deposited a thin supplemental etching barrier layer 76. This barrier layer is typically composed of deposited silicon dioxide or silicon nitride, with a thickness of about 50 to 100 nanometers. Over this inorganic barrier layer is applied the high resolution photoresist film 78, with a thickness in the range of 500 nanometers. This upper layer 78 is exposed in conventional manner first to actinic radiation 60—60 patterned by opaque layer 56 on plate 54, and then a development cycle. In this way, a high resolution aperture pattern is formed in photoresist layer 78, exposing selected regions of the underlying silicon dioxide or nitride barrier layer 76. The barrier layer 76 is then selectively etched away (FIG. 4B) using the top photoresist layer 78 as the etching barrier, to form a high resolution pattern of apertures 80—80 in the thin barrier layer 76. Next the aperture pattern 80—80 in the barrier layer 76 is itself used as a mask for selective patterning lower photoresist layer 72 (FIG. 4C), preferably by direct conventional photolithographic processing, to produce the deep aperture pattern 82—82. The resulting prior art mask barrier structure is then ready to govern the etching of the substrate.

It will therefore be seen that the simple single-layer process now disclosed can be used to produce a mask pattern having a resolution comparable to that produced by the complex multilayer process.

While the invention has been described with reference to a pair of preferred embodiments, it will be understood by those skilled in the art that various other changes may be made and equivalents may be substituted for elements thereof without departing from the scope of the invention. In addition, many modifications may be made to adapt a particular situation or material to the teachings of the invention without departing from the essential scope thereof. Therefore, it is intended that the broad aspects of the invention not be limited to the particular embodiments disclosed as the best mode contemplated for carrying out the invention, but that the invention will include all embodiments falling within the scope of the appended claims.

We claim:

1. A process for creating a layer of patterned photoresist on a surface, said process comprising the steps of:
   forming on said surface a first layer of polymeric photoresist material;
   converting selected pattern regions adjacent to the surface of said first layer to monomeric form by selectively exposing such pattern regions to depolymerizing wavelength energy;
   conditioning said first layer to render a relatively thin surface layer of the polymeric photoresist material substantially opaque to depolymerizing wavelength energy without materially changing the developing characteristics of the pattern regions of monomeric form;
   further exposing first layer polymeric photoresist material to depolymerizing wavelength energy to extend the monomer form region pattern through the full thickness of said first layer using the relatively thin and opaque surface layer as a mask to depolymerizing wavelength energy; and
   developing out the monomeric pattern regions of the photoresist.

2. The process recited in claim 1, wherein said step of further exposing said selected regions of said first layer material is performed with a blanket exposure of the first layer material.

3. A process for creating a layer of patterned photoresist on a surface, said process comprising the steps of:
   forming on said surface a first layer of polymeric photoresist material;
   converting selected regions of said first layer to monomeric form by selectively exposing such regions to depolymerizing wave length energy;
   conditioning said first layer to render a surface layer of the polymeric photoresist material substantially opaque to depolymerizing wavelength energy without materially affecting the regions of monomeric form;
   forming on said surface a second layer of polymeric photoresist material;
   exposing selective regions of said second layer material to depolymerizing wavelength energy until the regions of monomeric form in said second layer material reach the surface of selected monomeric regions in said first layer of material; and
   developing out the monomeric regions of the photoresist.

4. The process recited in claim 3, wherein said step of exposing selected regions of said second layer material extends such regions laterally beyond the exposed selected regions of said first layer material.

5. The process recited in claim 3 or 4, wherein the polymeric photoresist material in said first layer is soluble in a carrier solvent in said second layer material, and said conditioned surface layer of said first polymeric photoresist material is an insoluble barrier to said carrier solvent.

6. The process recited in claim 3 or 4, wherein the thickness of said first layer is materially less than the thickness of said second layer.

7. The process recited in claim 6, wherein the thickness of said second layer is at least twice the thickness of said first layer.

* * * * *